(12) United States Patent
Fiori, Jr.

(10) Patent No.: US 6,211,731 B1
(45) Date of Patent: Apr. 3, 2001

(54) IMPEDANCE ALTERING APPARATUS

(76) Inventor: David Fiori, Jr., 1083 S. Kimbles Rd., Yardley, PA (US) 19067

(*) Notice: Subject to any disclaimer, the term of this patent is extended or adjusted under 35 U.S.C. 154(b) by 0 days.

(21) Appl. No.: 09/593,353

(22) Filed: Jun. 14, 2000

Related U.S. Application Data

(63) Continuation of application No. 09/119,136, filed on Jul. 20, 1998, now Pat. No. 6,078,215.

(51) Int. Cl.[7] .................. H03F 3/45; H03F 1/14; H03H 11/00
(52) U.S. Cl. .................. 330/69; 330/292; 330/213
(58) Field of Search .................. 330/69, 284, 291, 330/292, 293, 310; 333/213

(56) References Cited

U.S. PATENT DOCUMENTS

| | | |
|---|---|---|
| 3,747,008 * | 7/1973 | Zaretsky .................. 330/110 |
| 3,810,035 | 5/1974 | Gundry . |
| 3,816,661 * | 6/1974 | Huszty et al. .................. 330/69 |
| 4,283,604 | 8/1981 | Chambers, Jr. . |
| 4,583,052 | 4/1986 | Ishii . |
| 4,963,845 | 10/1990 | Collier . |
| 4,979,218 | 12/1990 | Strahm . |
| 5,095,282 | 3/1992 | Dayton . |
| 5,399,993 | 3/1995 | Kleinberg . |
| 5,475,327 | 12/1995 | Wu et al. . |
| 5,568,561 | 10/1996 | Whitlock . |
| 5,694,081 | 12/1997 | Fiori, Jr. . |
| 5,751,823 | 5/1998 | Strickland et al. . |
| 5,861,775 * | 1/1999 | Chen et al. .................. 330/69 |

FOREIGN PATENT DOCUMENTS 526884   8/1972   (CH) .

* cited by examiner

Primary Examiner—Robert Pascal
Assistant Examiner—Patricia T. Nguyen
(74) Attorney, Agent, or Firm—Caesar, Rivise, Bernstein, Cohen & Pokotilow, Ltd.

(57) ABSTRACT

A circuit for modifying the impedance of a subject circuit includes a driving impedance element having an impedance characteristic which is substantially proportional to the impedance characteristics of the subject circuit. The circuit of the present circuit further includes a voltage controlled voltage source circuit which is coupled to the driving impedance element to proportionally add or subtract current from the applied subject circuit. The voltage controlled voltage source circuit provides a given voltage to the combined subject circuit and driver impedance element that is effectively proportional to the voltage potential difference across the subject circuit, thereby providing an enhanced effective impedance for the subject circuit.

4 Claims, 8 Drawing Sheets

IMPEDANCE ALTERING APPARATUS

RELATED APPLICATIONS

This application is a continuation of application Ser. No. 09/119,136, filed Jul. 20, 1998 now U.S. Pat. No. 6,078,215, entitled IMPEDANCE ALTERING APPARATUS and whose entire disclosure is incorporated by reference herein.

BACKGROUND

1. Technical Field

The present disclosure relates generally to impedance altering circuits, and more particularly relates to circuits and methods for increasing the impedance of a circuit by balancing the current flow into and out of the circuit.

2. Description of the Related Art

Circuits which provide for a precise increase in a given impedance are well known in the art.

One effect known to alter the equivalent impedance at a subject node is frequently described in connection with the capacitive grid-cathode impedances in an electron tube as related to the plate-cathode capacitive impedance. This is known as the Miller Effect. In such circuits the equivalent input impedance is a function of an impedance coupling the subject node to another node whose voltage potential is proportional to a voltage potential present at the subject node. The effective impedance at the subject node is an accurately related to this proportion.

Figure 1:
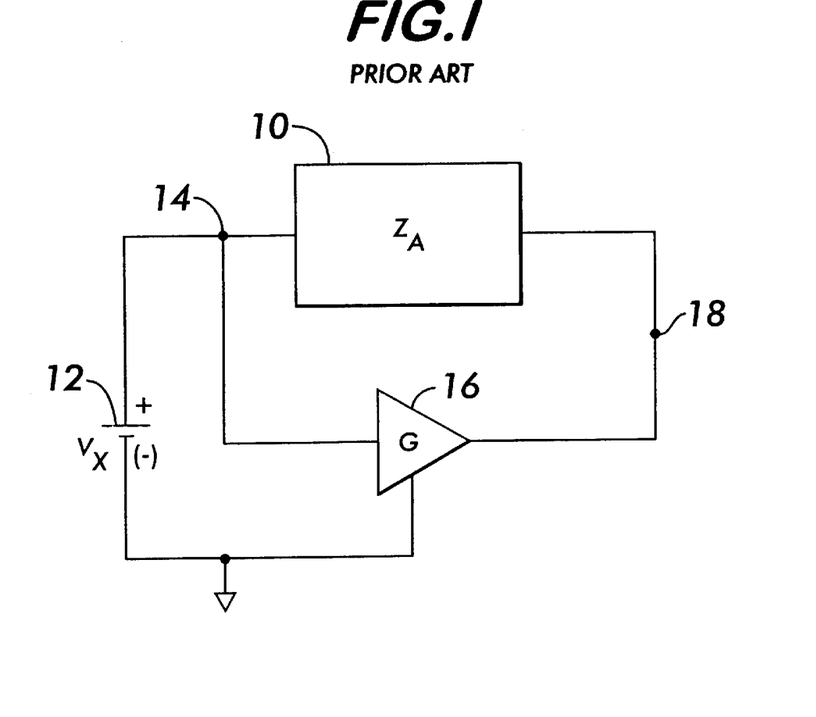
FIG. 1 is a schematic diagram of a circuit known in the prior art employing the Miller Effect to alter an effective impedance of a circuit.

Referring to FIG. 1, a reference impedance element 10 having a value $Z_A$, is subject to an applied voltage from voltage source 12 at node 14. A voltage controlled voltage source circuit (VCVS) circuit 16 is included and has an input terminal coupled to node 14 and an output terminal coupled to impedance element 10. The VCVS 16 has a voltage gain G describing the voltage produced at node 18 by the VCVS with respect to a voltage $V_X$ at node 14. Accordingly, the effective impedance at node 14, $Z_{effective}$, is the ratio of the voltage $V_X$ divided by the current flowing through voltage source 12, $I_{VX}$. This proportion is related to the gain G as follows:

$$Z_{effective} = V_X/I_{VX} = Z_A/(1-G) \quad (1)$$

The principal drawback of such a circuit is that the impedance upon which the effective impedance is based must be connected to one end of the VCVS 16. For this reason, circuits which increase the impedance between two given nodes in a circuit cannot be implemented without a substantially more costly circuit. Such circuits, therefore, are practically limited to adjusting the effective impedance at only a single circuit node, with the other node subject to the short circuit impedance of the VCVS circuit 16. Hence, such circuits are typically not symmetrical with respect to the two nodes 14, 18 of impedance element 10.

Circuits as illustrated in FIG. 1, are also identified as bootstrap circuits, as exemplified by U.S. Pat. No. 5,568,561 to Whitlock. The Whitlock patent describes a circuit which utilizes the principle of the Miller Effect described above, where the factor G is determined to be very nearly one by virtue of a unity gain buffer circuit.

Accordingly, it is an object to alter the effective impedance between two nodes in a circuit between which a given fixed impedance element exists without interjecting any additional circuits in series with the fixed impedance.

It is another object to provide enhanced control of a circuit impedance using a potentiometer in a manner that is more stable over temperature than a conventional variable resistor, and which is capable of producing a controllable impedance with an accuracy and temperature stability on the order of the fixed components that constitute the circuit.

It is a further object to modify an impedance of a subject circuit impedance with a circuit that cancels the effect of the subject circuit impedance on external connected circuitry.

It is yet another object of the present invention to implement precision voltage dividers with smaller resistance values in such a way that precision voltage division can be performed without loading the source voltage potential that is so divided.

It is still another object to enhance the implementation of differential amplifier circuits whose circuits are isolated with respect to other related circuits in a way that enhances not only the input impedance characteristics but also the output impedance characteristics in such cases.

It is yet another object to generally increase the input impedance of a given circuit without altering the function of any existing impedances in or related to the given circuits input impedance.

It is yet a further object to provide enhanced levels of isolation between an input and an output of a signal conditioning circuit without compromising the performance of such circuits in any way.

It is yet another objective to increase the dynamic isolation of a practical current source.

It is yet a further object to perform accurate impedance enhancement over a range of frequencies.

SUMMARY

In accordance with a first embodiment there is disclosed a circuit for modifying the impedance of a subject circuit includes a driving impedance element having an impedance characteristic which is substantially proportional to the impedance characteristics of the subject circuit. The present circuit also includes a voltage controlled voltage source (VCVS) which is coupled to the driving impedance element to proportionally add current to, or subtract current from, the applied subject circuit. The VCVS circuit provides a voltage to the combined subject circuit and driver impedance element that is proportional to a voltage potential across the subject circuit, thereby enhancing the effective impedance of the subject circuit.

These and other features, objects and advantages of the present circuits will become apparent from the following detailed description of illustrative embodiments thereof, which is to be read in connection with the accompanying drawings.

BRIEF DESCRIPTION OF THE DRAWINGS

The present circuits will be described in detail in the following description of preferred embodiments with reference to the following figures, wherein.

DETAILED DESCRIPTION OF PREFERRED EMBODIMENTS

The present circuit is directed to impedance altering circuits that accurately adjust the total current flow into and out of a subject circuit in a novel way to provide an enhanced effective impedance. The impedance altering circuits generally include a driving impedance element having an impedance characteristic which is substantially proportional to the impedance characteristics of the subject circuit. The impedance altering circuit also includes a voltage controlled voltage source (VCVS) which is coupled to the driving impedance element. The VCVS alters a current in the subject circuit by providing a voltage to the combined subject circuit and driver impedance element that is proportional to a voltage potential across the subject circuit. The effect can be applied substantially simultaneously, equally and symmetrically to both nodes of the subject impedance by forcing an identical current flow in each node.

Figure 2:
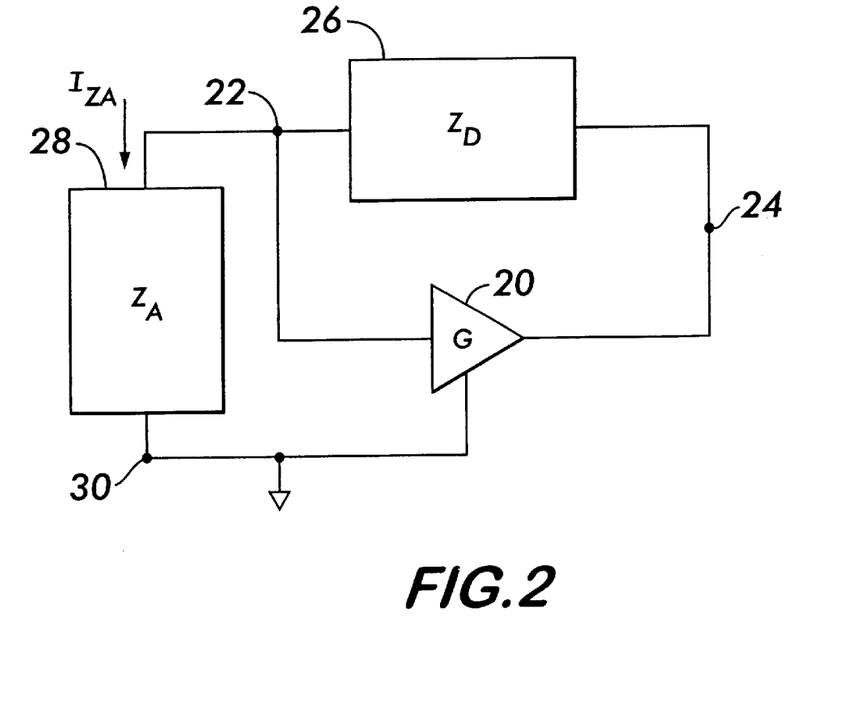
FIG. 2 is a simplified schematic diagram illustrating the operating principle of the present circuit.

FIG. 2 is a simplified schematic diagram which illustrates the principles of the present circuit. The circuit of FIG. 2 includes a voltage controlled voltage source circuit (VCVS) 20 having an input terminal 22 and an output terminal 24. A current balancing driver impedance element 26 is operatively coupled across the VCVS circuit 20. A subject impedance 28 is connected to input terminal 22 and to an isolated common terminal 30.

The equivalent impedance between nodes 22 and 30 is a function of the value of the reference impedance of the applied subject impedance 28 ($Z_A$), the value of the current balancing driver impedance element 26 ($Z_D$), and the gain of the VCVS circuit 20 (G). The driver impedance element 26, in combination with VCVS circuit 20, feeds a current into node 22 of the subject impedance and simultaneously draws the identical current from node 30. This condition is maintained providing that the VCVS circuit 20 draws no other current other than between node 30 and its output node 24.

This is the case when the VCVS circuit 20 is powered from an isolated power supply having a return through the isolated common terminal 30.

FIG. 2 shows a current $I_{ZA}$ flowing into the subject impedance 28. This current is proportional to the current that would be flowing into the subject impedance 28 as a function of a voltage across nodes 22 and 30. The mathematical relationship between the voltage gain of the VCVS circuit 20, the driver impedance element 26, and the resulting effective impedance can be described as follows:

Given:

$Z_{effective}$=the equivalent impedance resulting from the action of the present circuit between two given reference nodes;

$Z_A$=the intrinsic impedance of the subject impedance between the given reference nodes before application of the present circuit;

$Z_d$=the value of the driving impedance element 26; and

G=equivalent voltage gain of the VCVS circuit 20.

Then:

$$Z_{effective}=Z_a/(1-((G-1) \times Z_a/Z_d)) \quad (2)$$

With the VCVS circuit 20 powered from an isolated power supply, the net current flowing into the subject impedance 28, $I_{ZA}$, must flow out of node 30 in accordance with Kirchoff's current laws since there are no other pathways for the current. Hence, such isolation provides a symmetrical current on the equivalent impedance of the subject impedance. External circuits can therefore interact simultaneously with either node of impedance 28 with complete bilateral symmetry, as would be the case with conventional passive impedance components The above relationship shows how the effective impedance resulting between the two given nodes is related accurately to the gain G of the VCVS circuit 20. Hence, the effective impedance can be accurately adjusted by adjusting the gain G of this circuit.

Figure 3:
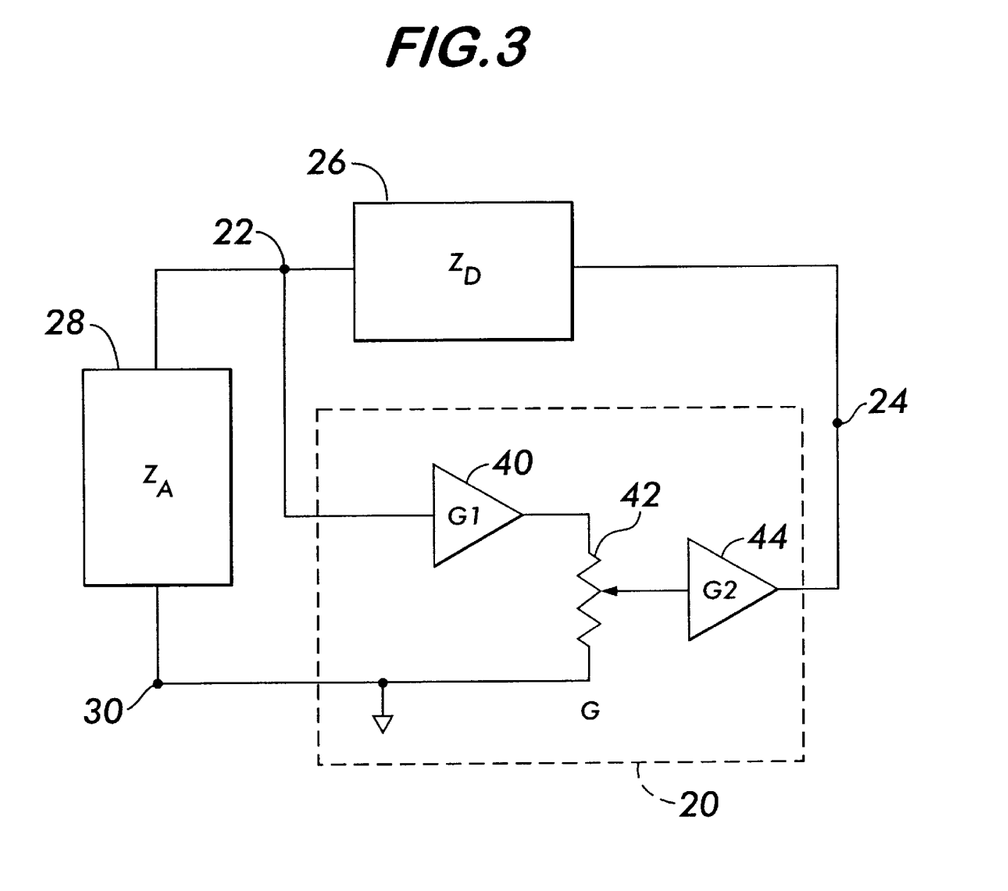
FIG. 3 is a schematic diagram illustrating an impedance adjustment circuit formed in accordance with the present circuit.

The gain of the VCVS circuit 20 can be altered in several ways. FIG. 3 illustrates a circuit embodiment where the value of the gain is adjusted by way of a potentiometer without adversely loading the subject impedance element 28. Referring to FIG. 3, the VCVS circuit 20 includes a first buffer amplifier 40 having an input terminal connected to node 22 and an output terminal connected to a track terminal of a potentiometer 42. A second track terminal of the potentiometer 42 is connected to node 30 of the subject impedance 28 which is connected to an isolated ground terminal. The potentiometer 42 has a wiper terminal coupled to an input terminal of a second buffer amplifier 44. The second buffer amplifier 44 has an output terminal coupled to node 24 of the driving impedance element 26. The first buffer amplifier 40 has a gain value of G1 and the second buffer amplifier 44 has a gain value of G2.

By driving the entire track of potentiometer 42 with the source voltage potential across the subject impedance 28, the movable wiper of the potentiometer 42 taps a voltage potential that is accurately proportional to the applied voltage in accordance with its wiper position. In this way, the input voltage of the VCVS can be precisely adjusted. The first buffer amplifier 40 isolates the potentiometer 42 from the subject impedance 28, thereby minimizing both loading effects and sensitivity to variations in the track impedance.

The gain of the VCVS circuit 20 is related to the buffer amplifier gains G1, G2 and the wiper position of the potentiometer 42. The gain, G, of this embodiment of VCVS circuit 20 is given by:

$$G=G1 \times G2 \times (Rw/Rt) \quad [3]$$

where Rw is the impedance from the current wiper position to node 30 and Rt is the total track impedance of the potentiometer 42.

An expression for the effective impedance of the circuit of FIG. 3, as viewed between nodes 22 and 30, is determined by substitution of equation [3] into equation [2] to yield:

$$Z_{effective}=Z_A/(1-((G1 \times G2 \times (Rw/Rt))-1) \times (Z_A/Z_D)) \quad [4]$$

Hence, the resulting effective impedance depends only on fixed impedance values, fixed gain values, and the ratio of tracking impedances in a standard potentiometer. Therefore, extremely accurate impedance control with respect to temperature, aging, and other effects can be attained.

In addition to modifying the effective impedance between two nodes, the gain of the VCVS circuit 20 can be set in such a way as to balance the current that would normally flow in the subject circuit such that the net current flow into and out of two nodes spanning a given subject is near zero. In this fashion, the present circuit is able to realize an extremely high effective impedance between two given circuit nodes without requiring high impedance circuit elements which adversely effect the precision capability of the subject circuit.

Such a current balancing circuit can also be used to increase the isolation between two circuits. Ideal current balancing and the highest possible isolation impedance is achieved in the present circuit when the following condition is met:

$$1=(G-1) \times Z_A/Z_D \quad [5]$$

or, by rearranging terms $$Z_D=Z_A \times (G-1)$$

Figure 4A:
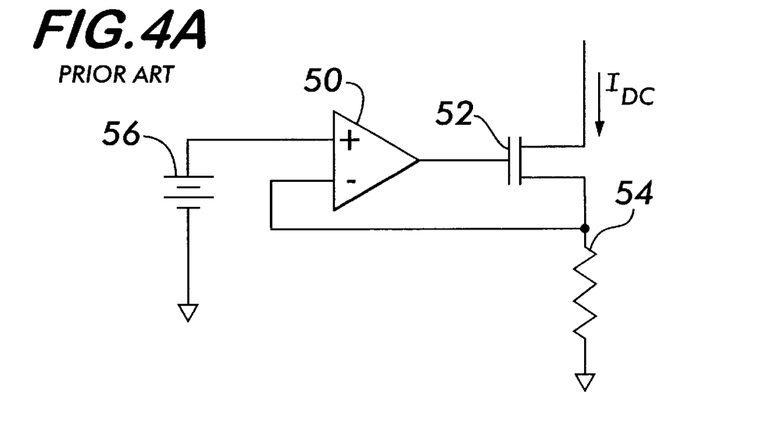
FIGS. 4A and 4B are schematic diagrams of a current source known in the prior art and a circuit model of same, respectively.
Figures 4B, 4C:
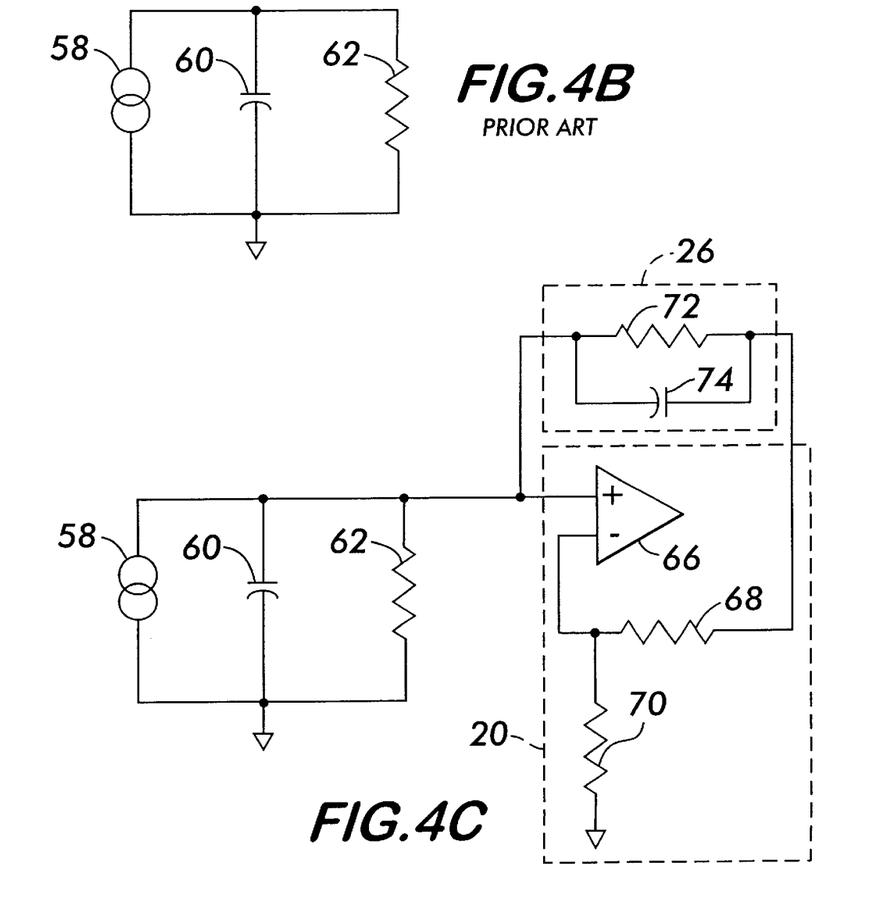
FIG. 4C is a schematic diagram of a high impedance current source formed in accordance with the present circuit.

By applying this principle, the present circuit can be used to provide a near ideal DC current source with an extraordinarily high dynamic AC impedance characteristic, as exemplified by the circuit of FIG. 4C. FIG. 4A shows a conventional current source circuit including an operational amplifier (op-amp) 50 driving a transistor 52 to establish a current $I_{DC}$ through transistor 52 and a resistor 54. The current $I_{DC}$ is accurately related in magnitude to the impedance of resistor 54 divided by a reference voltage 56 applied to the input of the operational amplifier 50. Such a circuit can be modeled as an ideal current source 58 in parallel with a capacitor 60 (essentially the small signal parameter $C_{rss}$ of transistor 52), and a very small leakage impedance 62, as shown in the equivalent circuit model of FIG. 4B.

Referring to FIG. 4C, the present circuit can be applied to minimize the effects of unwanted capacitor 60 and leakage impedance 62 which compromise the otherwise high AC impedance of current source 58. In FIG. 4C, the circuit includes an operational amplifier 66 having a gain value established by a ratio of a feedback resistor 68 and input resistor 70 in a manner well known in the art. The value of G for this circuit is expressed as $(R_{68}+R_{70})/R_{70}$. These values are selected such that equation [5] is satisfied. The driving impedance element 26 ($Z_D$) for this embodiment is formed by a capacitor 74 in parallel with a resistor 72. The circuit model of FIG. 4B represents a subject impedance, $Z_A$, which is applied to the present circuit. Accordingly, the values of capacitor 74 and resistor 72 are chosen to be proportional to the impedance characteristics of the parallel combination of capacitor 60 and impedance 62. In this way, the impedance effects of capacitor 60 and impedance 62 are effectively minimized, resulting in a DC current source possessing an extraordinarily high dynamic AC impedance.

If desired, gain adjustment techniques, such as that described in connection with FIG. 3, can be used to adjust the gain of the VCVS circuit 20 of FIG. 4C in order to trim out unit to unit component value variations.

The present circuit is also suitable for altering a subject circuit's effective input impedance without altering input filtering and input bias circuit characteristics of the subject circuit. Such an application is exemplified by the circuit illustrated in FIG. 5.

Figure 5:
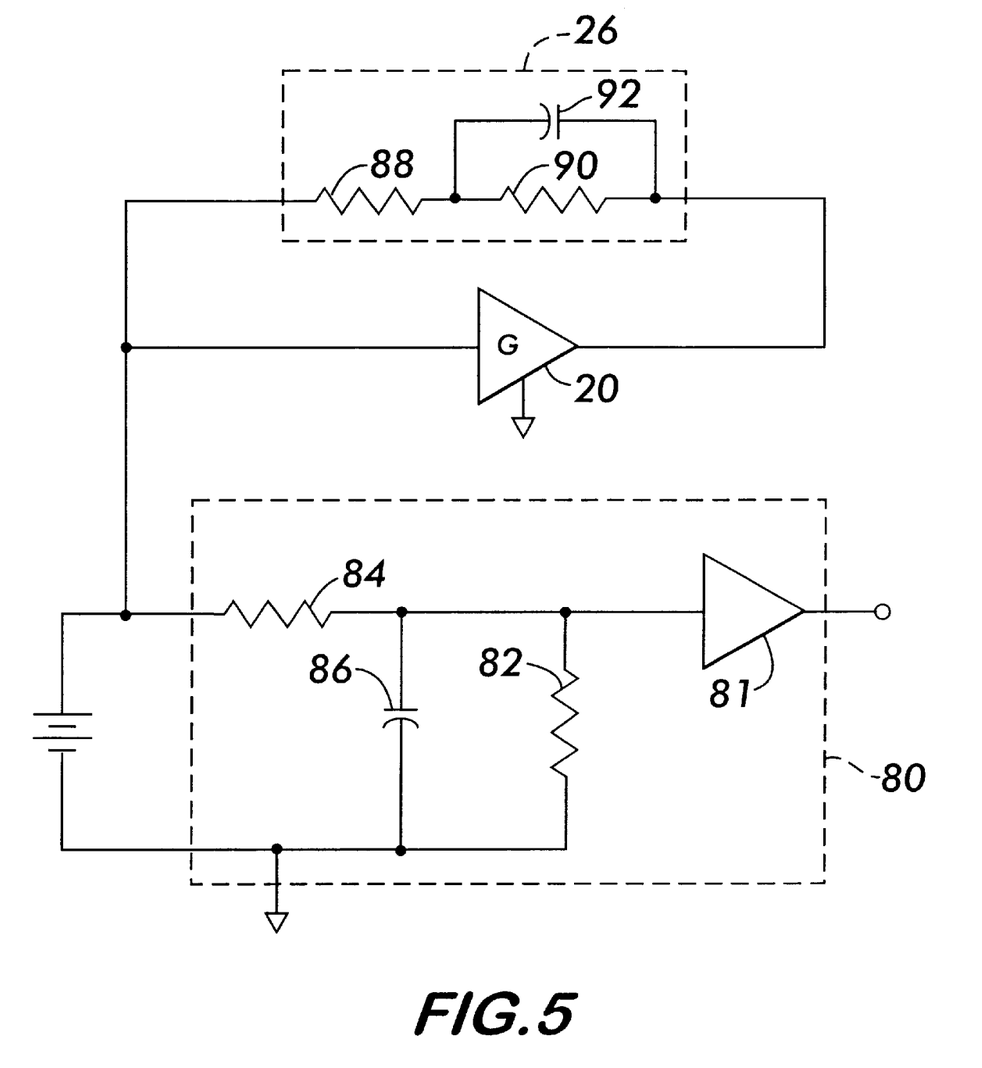
FIG. 5 is a schematic diagram of an impedance altering circuit employing current balancing and formed in accordance with the present circuit in cooperation with an exemplary audio preamplifier circuit.

FIG. 5 depicts a current balancing circuit in cooperation with a conventional single ended audio preamplifier circuit 80. The audio preamplifier circuit 80 includes an amplifier 81, an input bias resistor 82 and an input low pass filter formed from an input resistor 84 and a shunt capacitor 86. In this application, the VCVS circuit 20 of gain G is applied to a driving impedance element 26 composed of a first resistor 88 in series with a parallel circuit combination including a second resistor 90 and a capacitor 92. The values of the first resistor 88, second resistor 90 and capacitor 92 are selected to substantially counter-balance the current draw of the audio preamplifier input circuit composed of bias resistor 82, input resistor 84 and capacitor 86. In this way, a very large effective input impedance may be achieved while still providing for the bias circuit requirements of the preamplifier input circuit 80. Such a circuit need not be DC coupled to perform as required, since audio circuits need only address dynamic signals. This is especially true where the source may be AC coupled with series capacitors. The VCVS circuit 20 may be AC coupled, such as with a suitable series capacitor, either in series with its input, its output, or both, without compromising the desired effect.

Figure 6:
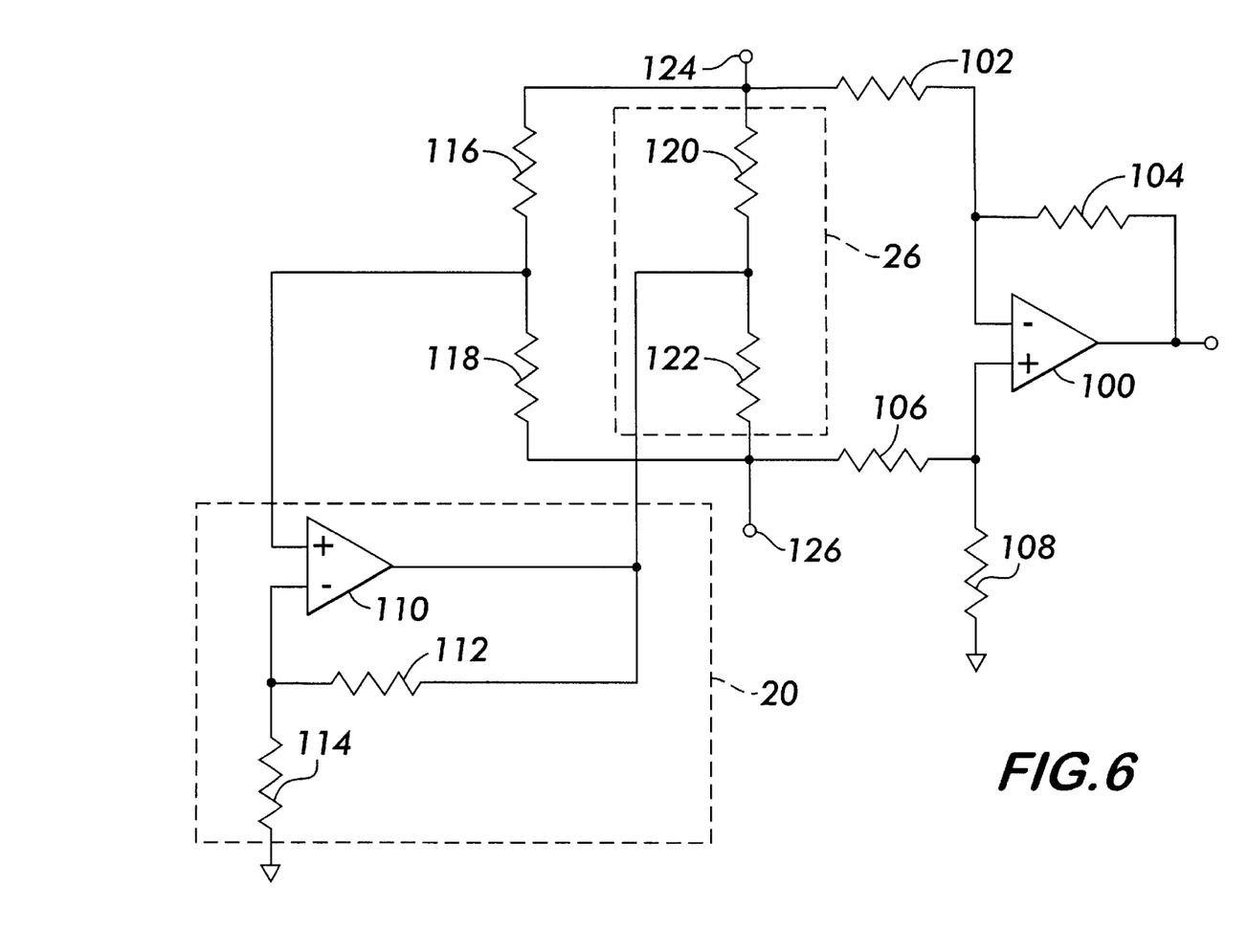
FIG. 6 is a schematic diagram of an impedance altering circuit employing current balancing and formed in accordance with the present circuit in cooperation with an exemplary differential amplifier circuit.

The present circuit may also be extended to differential amplifiers, as illustrated in FIG. 6. The differential amplifier circuit includes an amplifier element 100 having differential input terminals 124 and 126, resistors 102 and 104 forming an inverting input network and resistors 106 and 108 forming a non-inverting input network. It is generally desirable to achieve the maximum Common Mode Rejection Ratio (CMRR) in such circuits by accurately trimming resistors 102, 104, 106 and 108 such that their respective values meet the following condition:

$$(R_{104}/R_{102})=(R_{108}/R_{106}) \quad [6]$$

Such a condition of resistance ratios, in connection with circuits having leakage impedances of various kinds, will perform best with lower absolute values of resistors 102, 104, 106 and 108. However, such a circuit is extremely sensitive to any source impedance imbalance on its inputs. This problem can be ameliorated with large absolute values of resistors 102, 104, 106, and 108. Therefore, it is desirable to use resistors with a low absolute value but still achieve a high effective impedance such that a high Common Mode Rejection Ratio (CMRR) is attained without seriously increasing the susceptibility of the circuit to stray electric field interference and the effects of high impedance leakage currents. Applying the present circuit to a conventional differential amplifier circuit makes this possible.

Referring to FIG. 6, a VCVS circuit 20 is formed with an operational amplifier 110 and gain control resistors 112 and 114. The circuit of FIG. 6 further includes a first resistor 116, a second resistor 118, a third resistor 120 and a fourth resistor 122. The first resistor 116 and the second resistor 118 form a first series circuit which is coupled in parallel with a second series circuit formed with the third resistor 120 and fourth resistor 122. The input of the VCVS circuit 20 is coupled to the junction of the first resistor 116 and the second resistor 118. The output of the VCVS circuit 20 is coupled to the junction of the third resistor 120 and the fourth resistor 122. The driving impedance element 26 in this case is formed from the third resistor 120 and the fourth resistor 122. The first resistor 116 and second resistor 118 present a dynamic voltage proportional to the common mode input voltage to the VCVS 20. The inputs of the differential amplifier circuit, which represent the subject impedance ($Z_a$), are coupled to the resulting parallel circuit.

The action of VCVS circuit 20 is limited to the differential loading of resistors 116, 118, 120 and 122, and the very small currents necessary to counterbalance the normal input currents. In this application, resistors 120 and 122 form the driving impedance which compensates for the loading effects on the input terminals of resistors 102, 104, 106 and 108 in conjunction with op-amp 100. Again, where only AC dynamic characteristics are important, such as is the case with audio applications, the VCVS circuit 20 may be AC coupled to the subject circuit with a suitable series capacitor.

The highest attainable input impedance for the circuit of FIG. 6 is determined in the following manner. First, the common mode input impedance of the circuit is expressed mathematically as follows:

$$Z_A = (R_{102} + R_{104}) \times (R_{106} + R_{108}) / (R_{102} + R_{104} + R_{106} + R_{108}) \quad [7]$$

The common mode driving impedance of the circuit is expressed by the equation:

$$Z_{D=(R120} \times R_{122}) / (R_{120} + R_{122}) \quad [8]$$

The gain G of the VCVS circuit 20 of FIG. 6 is stated as:

$$G = (R_{112} + R_{114}) / R_{114} \quad [9]$$

To achieve the highest possible common mode input impedance, equations [7] through [9] are solved such that the current balancing condition set forth in equation [5] is satisfied.

Figure 7:
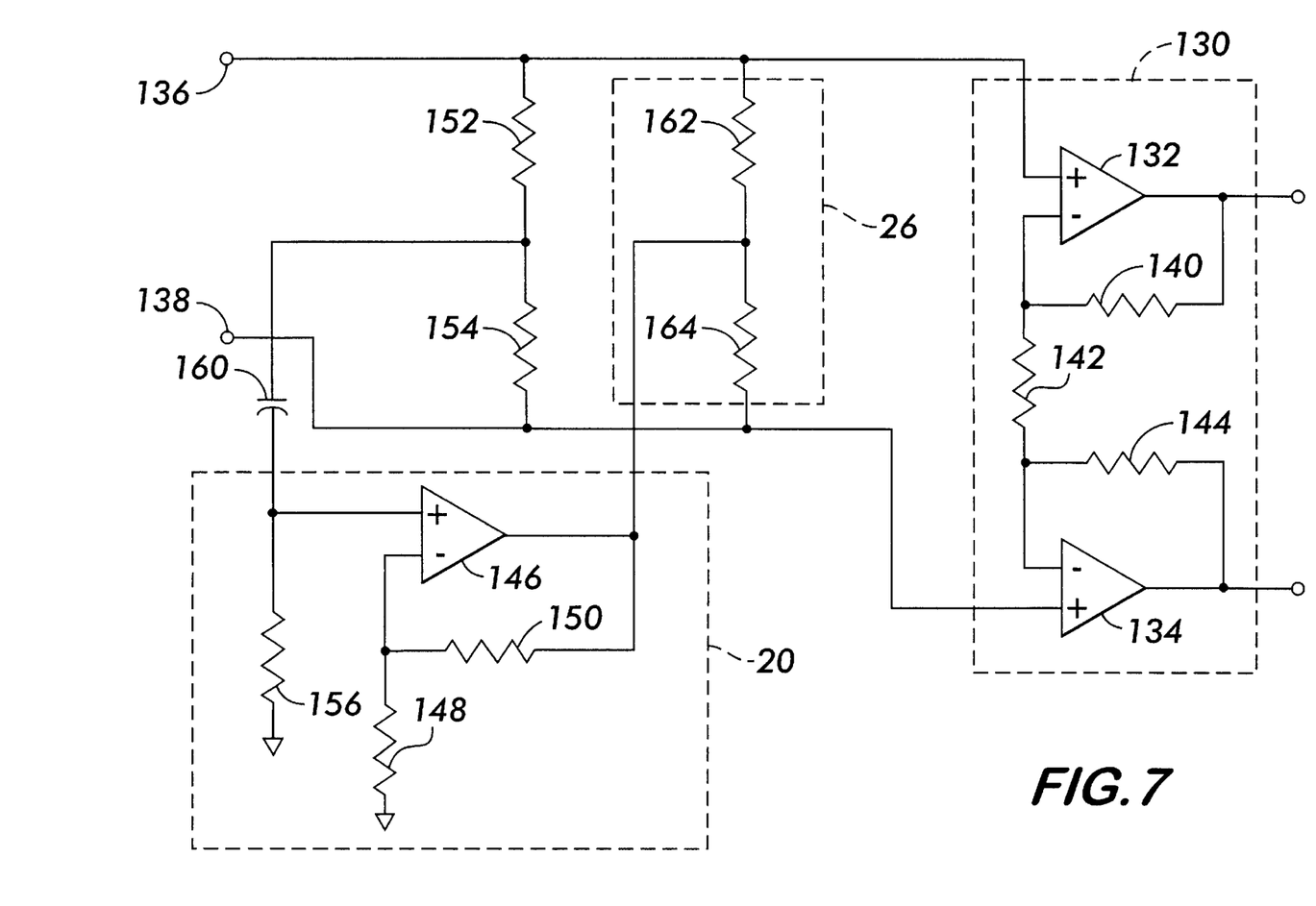
FIG. 7 is a schematic diagram of an impedance altering circuit employing current balancing and formed in accordance with the present circuit in cooperation with an exemplary balanced differential amplifier circuit.

FIG. 7 illustrates the present circuit applied to a balanced differential preamplifier circuit 130. The preamplifier circuit includes a first opamp 132 and a second opamp 134 which provide differential inputs 136 and 138. This circuit requires a set of bias resistors connected between ground and its inputs in order to function properly. Such circuits can benefit from increasing their common mode input impedances, thereby overcoming the impedance reducing effect of the bias resistors.

Referring to FIG. 7, the VCVS circuit 20 is formed with an operational amplifier 146 with gain setting resistors 148, 150. The circuit further includes resistors 152, 154 and 156, in conjunction with capacitor 160, which present a dynamic voltage proportional to the common mode input voltage to the VCVS circuit 20, in a similar fashion as in FIG. 6. Resistors 162 and 164 are included and function together as drive impedance element 26 and minimize the effect of the common mode loading of resistors 152, 154 and 156. In this case, resistor 156 provides the input bias current requirements of op-amp 146, and resistors 162 and 164 provide the input bias current requirements for op-amps 132 and 134.

The circuit values for the present circuit as applied to the circuit of FIG. 7 may be determined in the following manner. The input common mode reference impedance for the circuit of FIG. 7 may be expressed mathematically as follows:

$$Z_A = R_{156} + (R_{152} \times R_{154}) / (R_{152} + R_{154})) \quad [10]$$

The common mode driving impedance of the circuit in FIG. 7 circuit may be expressed mathematically as follows:

$$Z_D + (R_{162} \times R_{164})(R_{162} + R_{164}) \quad [11]$$

The gain of the VCVS circuit in this embodiment is expressed as:

$$G = (R_{148} + R_{150}) / R_{148} \quad [12]$$

To achieve the highest possible common mode input impedance, equations [10] through [12] are solved such that equation [5] is satisfied.

Figure 8:
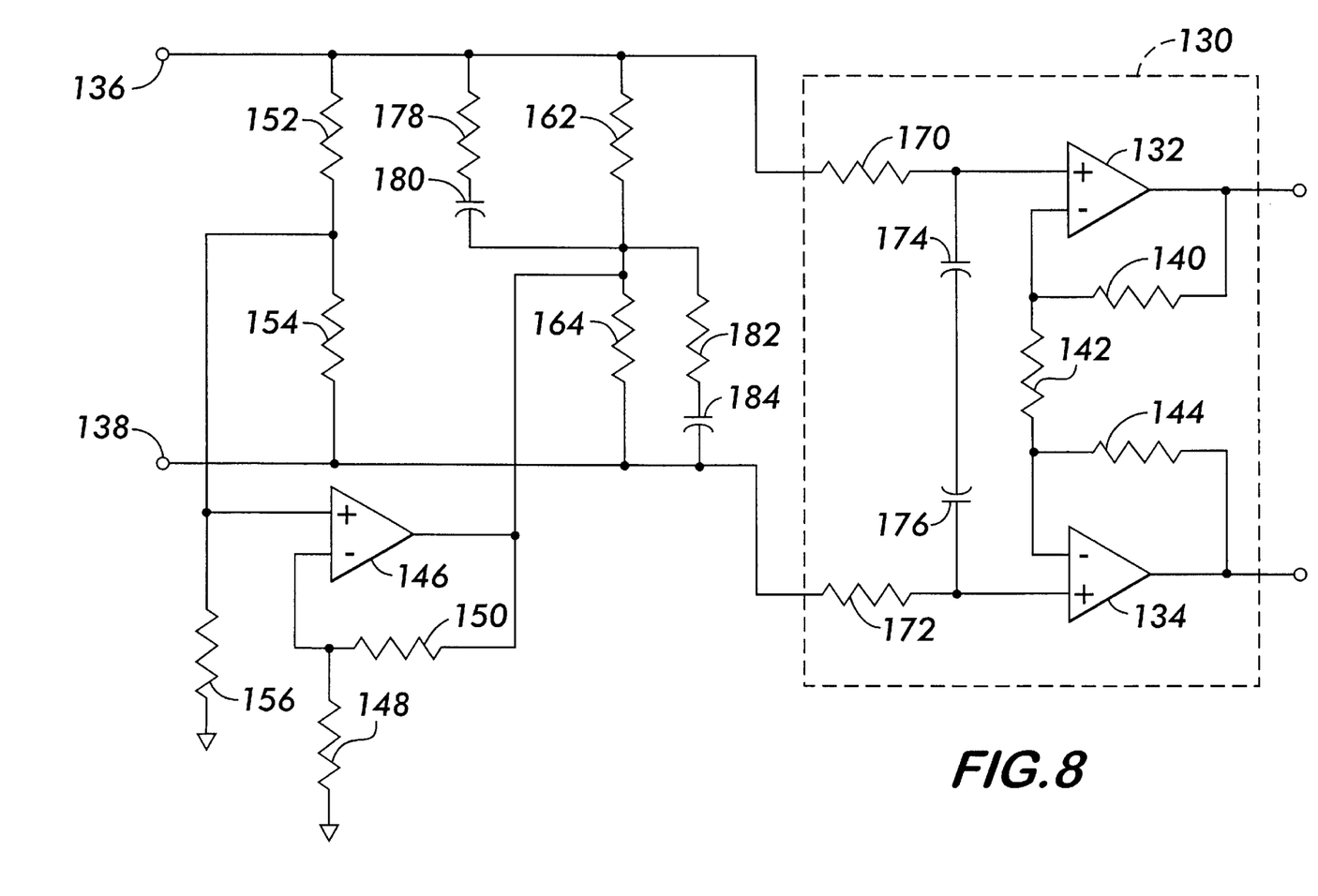
FIG. 8 is a schematic diagram of an impedance altering circuit employing current balancing and formed in accordance with the present circuit in cooperation with an exemplary balanced differential amplifier circuit having input filtering.

FIG. 8 is an exemplary application of the present circuit to a differential preamplifier circuit similar to that shown in FIG. 7, but now the preamplifier circuit includes differential and common mode input filtering elements applied to the input terminals 136, 138 formed with resistors 170, 172 and capacitors 174, 176. The dynamic impedances of these filtering elements can be counterbalanced, and to effect such a response, a resistor 178 is connected in series with a capacitor 180 and this series combination is coupled in parallel with resistor 162. Similarly, a resistor 182 is connected in series with a capacitor 184 and this series combination is coupled in parallel with resistor 164. In this embodiment, the values of resistor 178 and capacitor 180 are selected to be proportional to resistor 170 and capacitor 174. Similarly, the values of resistor 182 and capacitor 184 are selected to be proportional to the value resistor 172 and capacitor 176.

Figure 9:
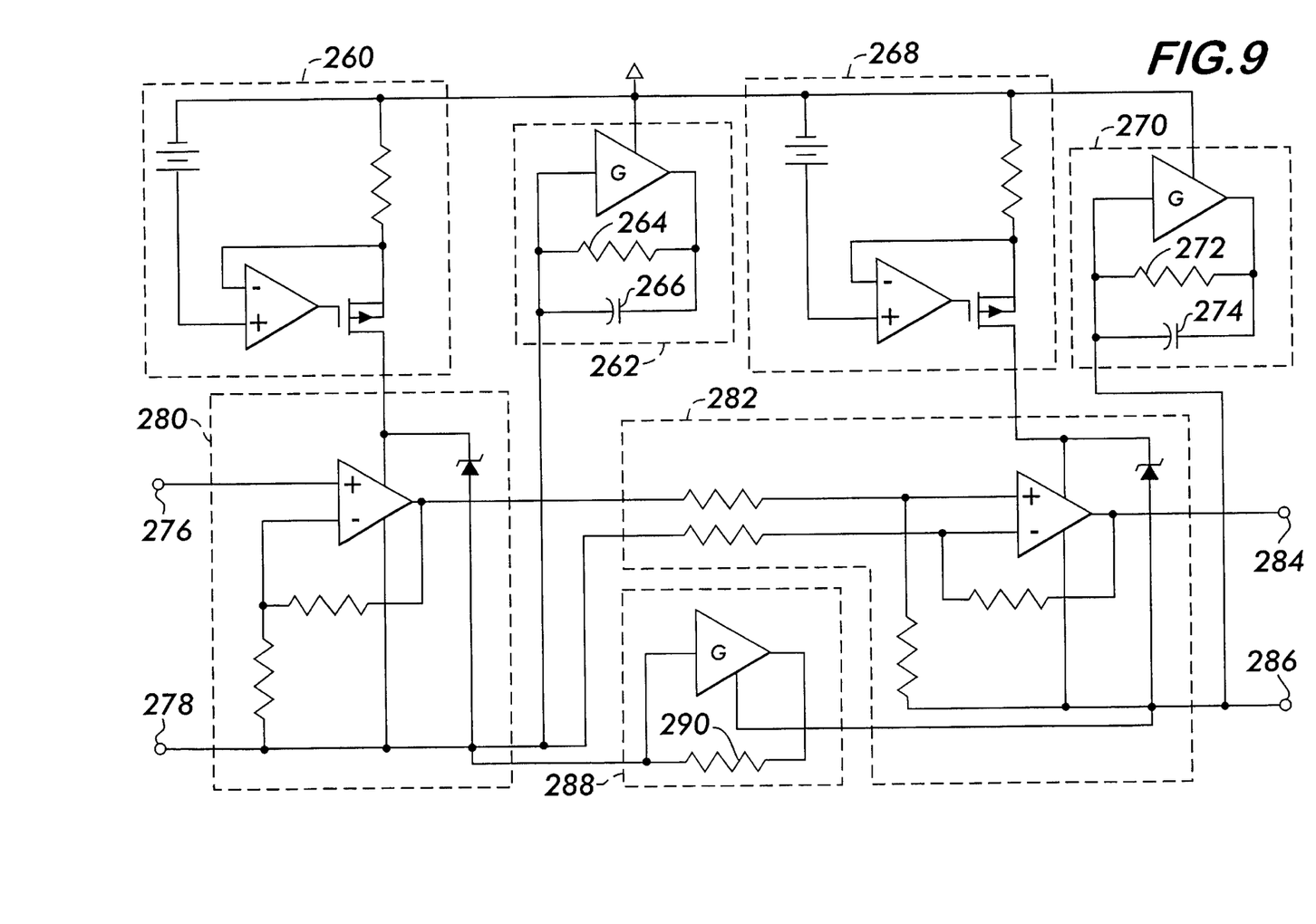
FIG. 9 is a schematic diagram of a signal conditioning apparatus improved by the application of circuits formed in accordance with the present circuit.

The present circuits can also be advantageously applied to a signal conditioning apparatus, as illustrated in FIG. 9. The signal conditioning circuit shown is designed to cancel common mode differences between the inputs and the outputs of the apparatus. A source signal input is applied to the circuit at input terminal 276 and the reference potential of the source signal is applied to terminal 278. The apparatus then provides an output signal at terminal 284 which is an amplified version of the difference between input connections 276, 278 as provided for by circuit 280, but which is expressed in relation to the output reference potential applied to connection 286, as a result of the action of differential amplifier 282.

Such a circuit is able to amplify the input source signal and deliver it to a destination while greatly suppressing any interference effect resulting from the difference between source and destination ground reference potentials. In practice, such a circuit is improved in its interference canceling characteristics according to the magnitude of the dynamic isolation impedance of its input and its output reference potential connections. The isolation impedance of the circuit in FIG. 9 with respect to its input and output terminals is the parallel combination of the isolation impedance of the respective power supplies 260, 268 and the effective impedance between input and output reference connections block 282 imposes.

The present impedance altering circuits are applied to provide enhanced AC isolation of current sources 260 and 268 in the signal conditioning circuit, in the same manner as illustrated and discussed in connection with FIG. 4. In this embodiment, resistor 264 and capacitor 266 form the driving impedance for the current balancing circuit 262 which counter balances the effects of the residual impedances of current source 260. In a like manner, resistor 272 and capacitor 274 in current balancing circuit 270 compensate for the effects of the residual impedance in current source 268. In addition, the impedance between input reference connection 278 and output reference connection 286 of the signal conditioning circuit, which is largely due to the internal resistances of the differential amplifier circuit 282, is also improved in a manner similar to that shown and discussed in connection with FIG. 6 of this disclosure. In this instance, resistor 290 is the driving impedance element in current balancing circuit 288 that substantially counteracts the effect of the effective input versus output impedance of the differential amplifier circuit 282.

The signal conditioning apparatus can also benefit from trimming circuits, such as is described in connection with FIG. 3, to provide accurate and stable precision adjustment capability.

Overall, the present invention improves the operation of signal conditioning circuits known in the art to a point exceeding the capabilities of modern signal isolation transformers. A signal conditioning circuit improved with the application of the present invention provides a superior alternative, even for demanding audio microphone applications.

Having described preferred embodiments, it is noted that modifications and variations can be made by persons skilled in the art in light of the above teachings. It is therefore to be understood that changes may be made in the particular embodiments disclosed which are within the scope and spirit of the circuit as defined by the appended claims.

What is claimed is:

1. A circuit for modifying an impedance characteristic of an applied subject circuit having an intrinsic impedance coupled between a first node and a second node to provide an enhanced effective impedance between said first and second nodes, the intrinsic impedance including a current source having at least a parasitic capacitance and a leakage impedance, said circuit comprising:
    a driving impedance having first and second ends and coupled at its first end to said first node, said driving impedance element having an impedance characteristic which is substantially proportional to the impedance characteristic of the intrinsic impedance of the subject circuit, said driving impedance including:
    a resistor; and
    a capacitor, said capacitor being coupled in parallel with said resistor, said resistor and said capacitor providing an impedance proportional to the parasitic capacitance and leakage impedance of the current source; and
    a voltage controlled voltage source circuit having an output coupled to said driving impedance at said second end, said voltage controlled voltage source comprising a gain value independent of said driving impedance element, said voltage controlled voltage source circuit modifying a current in the subject circuit to provide a voltage to the combined subject circuit and driver impedance element that is proportional to a voltage across the subject circuit, said voltage controlled voltage source circuit including:
        a first amplification stage;
        a second amplification stage; and
        a potentiometer, said potentiometer being interposed between said first amplification stage and said second amplification stage to vary said gain value of said voltage controlled voltage source circuit; and
    wherein said enhanced effective impedance is proportional to said gain value.

2. A circuit for modifying an impedance characteristic of an applied subject circuit having an intrinsic impedance coupled between a first node and a second node to provide an enhanced effective impedance between said first and second nodes, the intrinsic impedance including an audio amplifier circuit having a series input resistance, a shunt bias resistance and a shunt input capacitance, said circuit comprising:
    a driving impedance having first and second ends and coupled at its first end to said first node, said driving impedance element having an impedance characteristic which is substantially proportional to the impedance characteristic of the intrinsic impedance of the subject circuit, said driving impedance including a first resistor, a second resistor and a capacitor, said first resistor being coupled in parallel with said capacitor and said second resistor being coupled in series with said first resistor and capacitor; and
    a voltage controlled voltage source circuit having an output coupled to said driving impedance at said second end, said voltage controlled voltage source comprising a gain value independent of said driving impedance element, said voltage controlled voltage source circuit modifying a current in the subject circuit to provide a voltage to the combined subject circuit and driver impedance element that is proportional to a voltage across the subject circuit, said voltage controlled voltage source circuit including:
        a first amplification stage;
        a second amplification stage; and
        a potentiometer, said potentiometer being interposed between said first amplification stage and said second amplification stage to vary said gain value of said voltage controlled voltage source circuit; and
    wherein said enhanced effective impedance is proportional to said gain value.

3. A circuit for modifying an impedance characteristic of an applied subject circuit having an intrinsic impedance coupled between a first node and a second node to provide an enhanced effective impedance between said first and second nodes, the subject circuit including a differential amplifier circuit having an inverting input network and a non-inverting input network and wherein the intrinsic impedance comprises the parallel combination of the inverting input network and the non-inverting network, said circuit comprising:
    a driving impedance having first and second ends and coupled at its first end to said first node, said driving impedance element having an impedance characteristic which is substantially proportional to the impedance characteristic of the intrinsic impedance of the subject circuit, said driving impedance including a first resistor and a second resistor, said first resistor and second resistor connected as a series circuit, said series circuit being coupled across the inverting input network and the non-inverting input network of the subject circuit and wherein said second end is a junction of said first and second resistor; and;
    a voltage controlled voltage source circuit having an output coupled to said driving impedance element at said second end, said voltage controlled voltage source comprising a gain value independent of said driving impedance element, said voltage controlled voltage source circuit modifying a current in the subject circuit to provide a voltage to the combined subject circuit and driver impedance element that is proportional to a voltage across the subject circuit, said voltage controlled voltage source circuit including:

a first amplification stage;

a second amplification stage; and a potentiometer, said potentiometer being interposed between said first amplification stage and said second amplification stage to vary said gain value of said voltage controlled voltage source circuit; and wherein said enhanced effective impedance is proportional to said gain value.

4. A circuit for modifying an impedance characteristic of an applied subject circuit having an intrinsic impedance coupled between a first node and a second node to provide an enhanced effective impedance between said first and second nodes, the subject circuit including a balanced differential amplifier circuit having first and second operational amplifiers whose inverting inputs are coupled together and wherein respective input filtering elements are connected to respective non-inverting inputs of said first and second operational amplifiers and the respective input filtering elements form the intrinsic impedance, said circuit comprising:

a driving impedance having first and second ends and coupled at its first end to said first node, said driving impedance element having an impedance characteristic which is substantially proportional to the impedance characteristic of the intrinsic impedance of the subject circuit, said driving impedance element including:

a first resistor;

a second resistor, said first resistor and second resistor connected as a series circuit, said series circuit being coupled between the respective input filtering elements, and wherein said second end is a junction of said first resistor and second resistor;

a first series resistor-capacitor circuit, said first series resistor-capacitor circuit coupled across said first resistor; and a second series resistor-capacitor circuit, said second series resistor-capacitor circuit coupled across said second resistor; and a voltage controlled voltage source circuit having an output coupled to said driving impedance at said second end, said voltage controlled voltage source comprising a gain value independent of said driving impedance element, said voltage controlled voltage source circuit modifying a current in the subject circuit to provide a voltage to the combined subject circuit and driver impedance element that is proportional to a voltage across the subject circuit, said voltage controlled voltage source circuit including:

a first amplification stage;

a second amplification stage; and a potentiometer, said potentiometer being interposed between said first amplification stage and said second amplification stage to vary said gain value of said voltage controlled voltage source circuit; and wherein said enhanced effective impedance is proportional to said gain value.

* * * * *